United States Patent [19]

Ichinose et al.

[11] 4,131,479
[45] Dec. 26, 1978

[54] TRANSPARENT CERAMICS

[75] Inventors: Noboru Ichinose, Yokohama;
Hideo Ookuma, Kawasaki;
Toshiaki Mizutani, Yokohama;
Hideaki Hiraki, Kawasaki, all of
Japan

[73] Assignee: Tokyo Shibaura Electric Co., Ltd.,
Tokyo, Japan

[21] Appl. No.: 775,468

[22] Filed: Mar. 8, 1977

[30] Foreign Application Priority Data

Mar. 8, 1976 [JP] Japan ............................. 51-24217
Jul. 14, 1976 [JP] Japan ............................. 51-82920
Jul. 14, 1976 [JP] Japan ............................. 51-82921
Jan. 25, 1977 [JP] Japan ............................. 52-6428
Jan. 25, 1977 [JP] Japan ............................. 52-6429

[51] Int. Cl.² ............................................. C04B 35/00
[52] U.S. Cl. ............................................. 106/39.5; 106/46;
252/63.5; 252/300; 333/98 R; 361/321
[58] Field of Search .............. 106/46, 39.5; 423/593;
252/63.5

[56] References Cited

U.S. PATENT DOCUMENTS

| 2,864,713 | 12/1958 | Lewis | 106/39.5 |
| 3,619,744 | 11/1971 | Stephenson | 252/63.5 |
| 3,709,704 | 1/1973 | Matsuo et al. | 252/63.5 |
| 3,713,853 | 1/1973 | Matsuo et al. | 106/39.5 |

Primary Examiner—Helen McCarthy
Attorney, Agent, or Firm—Oblon, Fisher, Spivak, McClelland & Maier

[57] ABSTRACT

A transparent, complex oxide ceramic having the formula:

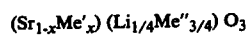

$(Sr_{1-x}Me'_x)(Li_{1/4}Me''_{3/4})O_3$ wherein x is 0.01–0.50, Me' is at least one metal selected from the group of Ca, Ba, and Pb, and Me" is Nb and/or Ta. The present ceramics can be used in the fabrication of gas discharge tubes and for infrared-ray tubes as optical devices and as substrates for higher quality electronic parts, and as an insulator for microwave frequency electronic devices.

2 Claims, No Drawings

TRANSPARENT CERAMICS

BACKGROUND OF THE INVENTION

Field of the Invention

The present invention relates to poreless ceramics which have excellent optical transmission properties.

Description of the Prior Art

Generally, poreless ceramics have excellent thermal, electrical, chemical and optical properties. Transparent ceramic materials can be used in the fabrication of, for example, crystron tubes, power tubes, antenna windows, integral circuit substrates, high pressure gas-discharge tubes, rocket nozzles, and the like. Currently, many transparent ceramic materials such as $Al_2O_3$, $MgO$, $Y_2O_3$, $BeO$, $Gd_2O_3$, $LiAl_5O_8$, $CaO$, $ThO_2$, $MgAl_2O_5$, $(Pb,La)(Ti,Zr)O_3$ and the like, are known. However, the conventional transparent ceramic materials all have problems concerning their dielectric constants and thermal constants. In addition, the conventional ceramic materials have to be fabricated under hot pressing conditions or special sintering atmospheres and at high sintering temperatures of about 2000° C. Therefore, the cost of these materials becomes expensive because of the necessity of indispensible, complicated facilities and because of difficulties in manufacturing.

A need, therefore, continues to exist for a ceramic material which is inexpensive to prepare and which possesses good optical transmission characteristics and dielectric properties.

SUMMARY OF THE INVENTION

Accordingly, one object of the present invention is to provide poreless ceramics having good optical transmission characteristics over a wide wavelength range and excellent dielectric properties.

Briefly, this object and other objects of the present invention as hereinafter will become more readily apparent can be attained by a transparent, complex oxide ceramic having the formula:

wherein Me' is at least one element selected from the group of Ca, Ba, and Pb; Me" is Nb and/or Ta and x is 0.01 to 0.50.

DESCRIPTION OF THE PREFERRED EMBODIMENTS

The oxide compound of the present invention is a transparent binary oxide of the perovskite-type having the formula:

$Sr(Li_{\frac{1}{4}}Me''_{\frac{3}{4}})O_3 \cdot Me'(Li_{\frac{1}{4}}Me''_{\frac{3}{4}})O_3$ wherein Me' is at least one element selected from the group of Ba, Ca and Pb, and Me" is Ta and/or Nb. This composition can be prepared from mixtures of raw materials by conventional ceramic fabrication techniques.

The transparent ceramic materials of this invention may be prepared in the following manner. The raw materials such as $SrO$, $BaO$, $CaO$, $PbO$, $Li_2O$, $Nb_2O_5$, $Ta_2O_5$ are accurately weighed out in prescribed amounts, are mixed in a ball mill and calcined at 900°–1100° C.

It is most desirable that the raw materials be of high purity. Suitable raw materials include such metal compounds as the hydroxides, carbonates and oxalates all of which can be converted to the corresponding oxide upon heating. The calcined powder is then pulverized. The powder thus obtained is mixed with a binder, such as water or polyvinyl alcohol, and the mixture is shaped under a pressure of about 0.5–2 tons/cm² into, for example, a plate having a diameter of 20 mm and a thickness of 1 mm. The plates are then sintered under temperature conditions of 1150°–1450° C. over a period of 2–4 hours, preferably under an oxygen atmosphere.

The composition of the present transparent ceramic material is defined by the formula:

wherein Me' is at least one element selected from the group of Ca, Ba and Pb; Me" is Ta and/or Nb, and x is 0.01–0.50. The preferred transmission levels are obtained over a compositional range for x of 0.01–0.50. When $x \leq 0.01$, the ceramic compositions cannot be sintered to a sufficient density, and when $x \geq 0.50$, a second phase is produced.

Having generally described the invention, a further understanding can be obtained by reference to certain specific examples which are provided herein for purposes of illustration only and are not intended to be limited unless otherwise specified.

EXAMPLES

Various mixtures of $SrCO_3$, $PbO$, $CaCO_3$, $BaCO_3$, $Li_2CO_3$, $Ta_2O_5$ were weighed out so as to obtain a series of materials having the formula 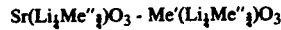, wherein x is 0–0.60. The components of each composition were mixed well in a ball mill. Each powder mixture was calcined at 1050° C. for 1 hour, and the resulting mass was pulverized into a powder. Then, each powder sample was mixed with polyvinyl alcohol as a binder, and each mixture was compressed into the shape of a plate of $20^\phi \times 1$ mm at 1 ton/cm². The green samples obtained were sintered at 1250° C. for 2 hours in an electric furnace.

By this technique 161 transparent ceramic plates including control samples were prepared. The density (P%), and the transmission characteristics (transparency or transmittivity) T (%) at 700 mμ of each of the plates were measured. Both sides of the measured plates were polished to a mirror finish. After the transparency measurement, a silver electrode was baked on each side of the sample plates. The permittivity (dielectric constant) ε characteristics of each plate were measured at a frequency of 1 MHz as indicated in Table 1. The transmission characteristics of the present ceramic are superior to the transmission characteristics of conventional $Al_2O_3$ ceramic.

The present transparent ceramic composition has many advantages when used in the following applications.

(1) It can be used as an optical element for flash lamp tubes and devices which use infrared rays, because the present ceramics exhibit excellent transparency to visible rays and infrared rays. Moreover, the present ceramics can be produced more easily and less expensively than the conventional $Al_2O_3$ ceramics.

(2) The present ceramics are used in the substrates of high quality electronic parts which can be applied to integral circuit substrates, for example, if the particular ceramic has excellent electrical properties. Because the present ceramic materials are poreless materials, it is evident that a substrate can be provided with a flat surface which has a roughness less than about one tenth of the wavelength of the light. Both sides of a transparent ceramic substrate can be used as a substrate for complicated circuit devices.

(3) The transparent electro-optic ceramics of the present invention can be used in microwave frequency devices. It is possible to miniaturize circuits by use of the present high dielectric permittivity and low loss ceramics.

TABLE I

| | $(Sr_{1-x}Me'_x)(Li_{1/4}Me''_{3/4})O_3$ | | | | | | | |
| | Me' | | | Me'' | | | | |
| | X | Ca | Ba | Pb | Nb | Ta | T(%) | ε (1MHz) | ρ (%) |
|---|---|---|---|---|---|---|---|---|---|
| control 1 | 0 | — | — | — | 1 | — | 12 | 39 | 97.0 |
| control 2 | 0.005 | 0.005 | — | — | 1 | — | 35 | 39 | 98.2 |
| example 1 | 0.01 | 0.01 | — | — | 1 | — | 40 | 39 | 99.5 |
| example 2 | 0.05 | 0.05 | — | — | 1 | — | 55 | 40 | 99.7 |
| example 3 | 0.1 | 0.1 | — | — | 1 | — | 60 | 41 | 99.9 |
| example 4 | 0.2 | 0.2 | — | — | 1 | — | 58 | 41 | 99.8 |
| example 5 | 0.3 | 0.3 | — | — | 1 | — | 60 | 42 | 99.8 |
| example 6 | 0.4 | 0.4 | — | — | 1 | — | 56 | 42 | 99.6 |
| example 7 | 0.5 | 0.5 | — | — | 1 | — | 40 | 43 | 99.0 |
| control 3 | 0.6 | 0.6 | — | — | 1 | — | 20 | 40 | 98.1 |
| example 8 | 0.02 | 0.01 | 0.01 | — | 1 | — | 48 | 39 | 99.0 |
| example 9 | 0.02 | 0.01 | — | 0.01 | 1 | — | 50 | 39 | 99.1 |
| example 10 | 0.1 | 0.05 | 0.05 | — | 1 | — | 58 | 39 | 99.3 |
| example 11 | 0.1 | 0.05 | — | 0.05 | 1 | — | 55 | 40 | 99.1 |
| example 12 | 0.2 | 0.1 | 0.1 | — | 1 | — | 60 | 40 | 99.5 |
| example 13 | 0.2 | 0.1 | — | 0.1 | 1 | — | 58 | 40 | 99.4 |
| example 14 | 0.3 | 0.15 | 0.15 | — | 1 | — | 65 | 40 | 99.6 |
| example 15 | 0.3 | 0.15 | — | 0.15 | 1 | — | 58 | 41 | 99.2 |
| example 16 | 0.3 | 0.1 | 0.1 | 0.1 | 1 | — | 60 | 41 | 99.5 |
| example 17 | 0.4 | 0.2 | 0.2 | — | 1 | — | 63 | 40 | 99.2 |
| example 18 | 0.4 | 0.1 | 0.3 | — | 1 | — | 65 | 41 | 99.3 |
| example 19 | 0.4 | 0.3 | 0.1 | — | 1 | — | 62 | 40 | 99.1 |
| example 20 | 0.4 | 0.2 | — | 0.2 | 1 | — | 60 | 41 | 99.0 |
| example 21 | 0.4 | 0.1 | — | 0.3 | 1 | — | 55 | 42 | 99.4 |
| example 22 | 0.4 | 0.3 | — | 0.1 | 1 | — | 64 | 40 | 99.2 |
| example 23 | 0.5 | 0.2 | 0.3 | — | 1 | — | 61 | 41 | 99.6 |
| example 24 | 0.5 | 0.3 | 0.2 | — | 1 | — | 63 | 41 | 99.5 |
| example 25 | 0.5 | 0.2 | — | 0.3 | 1 | — | 59 | 42 | 99.3 |
| example 26 | 0.5 | 0.3 | — | 0.2 | 1 | — | 62 | 42 | 99.2 |
| control 4 | 0.6 | 0.3 | 0.3 | — | 1 | — | 23 | 41 | 98.1 |
| control 5 | 0.6 | 0.3 | — | 0.3 | 1 | — | 20 | 42 | 98.4 |
| control 6 | 0.6 | 0.2 | 0.2 | 0.2 | 1 | — | 30 | 42 | 98.3 |
| control 7 | 0.005 | — | 0.005 | — | 1 | — | 30 | 39 | 97.5 |
| control 8 | 0.005 | — | — | 0.005 | 1 | — | 35 | 39 | 97.8 |
| example 27 | 0.01 | — | 0.01 | — | 1 | — | 48 | 39 | 98.9 |
| example 28 | 0.01 | — | — | 0.01 | 1 | — | 50 | 39 | 99.0 |
| example 29 | 0.1 | — | 0.1 | — | 1 | — | 50 | 39 | 99.0 |
| example 30 | 0.1 | — | — | 0.1 | 1 | — | 53 | 39 | 99.1 |
| example 31 | 0.2 | — | 0.2 | — | 1 | — | 55 | 40 | 99.3 |
| example 32 | 0.2 | — | 0.1 | 0.1 | 1 | — | 56 | 40 | 99.2 |
| example 33 | 0.2 | — | — | 0.2 | 1 | — | 54 | 40 | 99.1 |
| example 34 | 0.3 | — | 0.3 | — | 1 | — | 58 | 41 | 99.3 |
| example 35 | 0.3 | — | 0.2 | 0.1 | 1 | — | 55 | 41 | 99.0 |
| example 36 | 0.3 | — | 0.1 | 0.2 | 1 | — | 60 | 41 | 99.5 |
| example 37 | 0.3 | — | — | 0.3 | 1 | — | 59 | 41 | 99.5 |
| example 38 | 0.4 | — | 0.4 | — | 1 | — | 65 | 41 | 99.5 |
| example 39 | 0.4 | — | 0.3 | 0.1 | 1 | — | 70 | 41 | 99.6 |
| example 40 | 0.4 | — | 0.2 | 0.2 | 1 | — | 68 | 41 | 99.3 |
| example 41 | 0.4 | — | 0.1 | 0.3 | 1 | — | 60 | 41 | 99.2 |
| example 42 | 0.4 | — | — | 0.4 | 1 | — | 50 | 41 | 99.0 |
| example 43 | 0.5 | — | 0.5 | — | 1 | — | 60 | 43 | 99.2 |
| example 44 | 0.5 | — | 0.4 | 0.1 | 1 | — | 65 | 43 | 99.3 |
| example 45 | 0.5 | — | 0.3 | 0.2 | 1 | — | 61 | 43 | 99.1 |
| example 46 | 0.5 | — | 0.2 | 0.3 | 1 | — | 58 | 43 | 99.0 |
| example 47 | 0.5 | — | 0.1 | 0.4 | 1 | — | | 43 | 99.0 |
| example 48 | 0.5 | — | — | 0.5 | 1 | — | | 43 | |
| control 9 | 0.6 | — | 0.6 | — | 1 | — | 35 | 42 | 98.5 |
| control 10 | 0.6 | — | 0.5 | 0.1 | 1 | — | 39 | 42 | 98.3 |
| control 11 | 0.6 | — | 0.4 | 0.2 | 1 | — | 30 | 42 | 98.8 |
| control 12 | 0.6 | — | 0.3 | 0.3 | 1 | — | 20 | 42 | 98.4 |
| control 13 | 0.6 | — | 0.2 | 0.4 | 1 | — | 10 | 42 | 97.0 |
| control 14 | 0.6 | — | 0.1 | 0.5 | 1 | — | 8 | 42 | 97.5 |
| control 15 | 0.6 | — | — | 0.6 | 1 | — | 5 | 42 | 96.5 |
| control 16 | 0 | — | — | — | — | 1 | 13 | 37 | 97.0 |
| control 17 | 0.005 | — | 0.005 | — | — | 1 | 30 | 37 | 98.0 |
| example 49 | 0.01 | — | 0.01 | — | — | 1 | 50 | 38 | 99.0 |
| example 50 | 0.1 | — | 0.1 | — | — | 1 | 52 | 38 | 99.1 |
| example 51 | 0.2 | — | 0.2 | — | — | 1 | 53 | 38 | 99.3 |
| example 52 | 0.3 | — | 0.3 | — | — | 1 | 60 | 39 | 99.2 |
| example 53 | 0.4 | — | 0.4 | — | — | 1 | 58 | 39 | 99.5 |
| example 54 | 0.5 | — | 0.5 | — | — | 1 | 60 | 39 | 99.1 |
| control 18 | 0.6 | — | 0.6 | — | — | 1 | 20 | 38 | 98.5 |
| control 19 | 0.005 | 0.005 | — | — | — | 1 | 28 | 37 | 98.0 |
| example 55 | 0.01 | 0.01 | — | — | — | 1 | 50 | 37 | 99.1 |
| example 56 | 0.1 | 0.1 | — | — | — | 1 | 55 | 38 | 99.3 |
| example 57 | 0.2 | 0.2 | — | — | — | 1 | 60 | 38 | 99.5 |
| example 58 | 0.3 | 0.3 | — | — | — | 1 | 65 | 39 | 99.1 |
| example 59 | 0.4 | 0.4 | — | — | — | 1 | 70 | 39 | 99.4 |
| example 60 | 0.5 | 0.5 | — | — | — | 1 | 65 | 40 | 99.0 |
| control 20 | 0.6 | 0.6 | — | — | — | 1 | 15 | 38 | 98.7 |
| control 21 | 0.005 | — | — | 0.005 | — | 1 | 20 | 37 | 98.0 |
| example 61 | 0.01 | — | — | 0.01 | — | 1 | 45 | 37 | 99.2 |

TABLE I-continued

| | $(Sr_{1-x}Me'_x)(Li_{1/4}Me''_{3/4})O_3$ | | | | | | | |
| | | Me' | | Me'' | | | | |
| | X | Ca | Ba | Pb | Nb | Ta | T(%) | $\epsilon$ (1MHz) | $\rho$(%) |
|---|---|---|---|---|---|---|---|---|---|
| control 62 | 0.1 | — | — | 0.1 | — | 1 | 48 | 37 | 99.3 |
| example 63 | 0.2 | — | — | 0.2 | — | 1 | 50 | 38 | 99.1 |
| example 64 | 0.3 | — | — | 0.3 | — | 1 | 51 | 39 | 99.0 |
| example 65 | 0.4 | — | — | 0.4 | — | 1 | 48 | 40 | 99.6 |
| example 66 | 0.5 | — | — | 0.5 | — | 1 | 41 | 41 | 99.2 |
| control 22 | 0.6 | — | — | 0.6 | — | 1 | 10 | 50 | 98.7 |
| control 23 | 0.6 | 0.3 | 0.3 | — | — | 1 | 25 | 38 | 98.4 |
| control 24 | 0.6 | — | 0.3 | 0.3 | — | 1 | 5 | 40 | 98.6 |
| control 25 | 0.6 | 0.3 | — | 0.3 | — | 1 | 10 | 40 | 97.3 |
| example 67 | 0.2 | 0.1 | 0.1 | — | — | 1 | 65 | 39 | 99.7 |
| example 68 | 0.2 | 0.1 | — | 0.1 | — | 1 | 52 | 39 | 99.4 |
| example 69 | 0.2 | — | 0.1 | 0.1 | — | 1 | 50 | 39 | 99.2 |
| example 70 | 0.3 | 0.1 | 0.1 | 0.1 | — | 1 | 60 | 39 | 99.2 |
| example 71 | 0.3 | — | 0.1 | 0.2 | — | 1 | 55 | 39 | 99.4 |
| example 72 | 0.3 | 0.1 | — | 0.2 | — | 1 | 53 | 39 | 99.1 |
| example 73 | 0.3 | 0.1 | 0.2 | — | — | 1 | 70 | 39 | 99.6 |
| example 74 | 0.3 | — | 0.2 | 0.1 | — | 1 | 58 | 39 | 99.6 |
| example 75 | 0.3 | 0.2 | — | 0.1 | — | 1 | 56 | 39 | 99.7 |
| example 76 | 0.3 | 0.2 | 0.1 | — | — | 1 | 65 | 39 | 99.4 |
| control 26 | 0.6 | 0.2 | 0.2 | 0.2 | — | 1 | 14 | 39 | 98.6 |
| control 27 | 0.6 | — | 0.3 | 0.3 | — | 1 | 12 | 45 | 98.3 |
| control 28 | 0.6 | 0.3 | — | 0.3 | — | 1 | 16 | 43 | 98.9 |
| control 29 | 0.6 | 0.3 | 0.3 | — | — | 1 | 20 | 38 | 98.7 |
| example 77 | 0.2 | 0.2 | — | — | 0.8 | 0.2 | 60 | 40 | 99.8 |
| example 78 | 0.2 | 0.2 | — | — | 0.6 | 0.4 | 63 | 40 | 99.2 |
| example 79 | 0.2 | 0.2 | — | — | 0.4 | 0.6 | 62 | 39 | 99.4 |
| example 80 | 0.2 | 0.2 | — | — | 0.2 | 0.8 | 61 | 39 | 99.3 |
| example 81 | 0.4 | 0.4 | — | — | 0.8 | 0.2 | 57 | 42 | 99.7 |
| example 82 | 0.4 | 0.4 | — | — | 0.6 | 0.4 | 60 | 40 | 99.6 |
| example 83 | 0.4 | 0.4 | — | — | 0.4 | 0.6 | 65 | 40 | 99.3 |
| example 84 | 0.4 | 0.4 | — | — | 0.2 | 0.8 | 69 | 39 | 99.5 |
| control 30 | 0.6 | 0.6 | — | — | 0.8 | 0.2 | 30 | 40 | 98.5 |
| control 31 | 0.6 | 0.6 | — | — | 0.6 | 0.4 | 35 | 40 | 98.8 |
| control 32 | 0.6 | 0.6 | — | — | 0.4 | 0.6 | 25 | 39 | 99.7 |
| control 33 | 0.6 | 0.6 | — | — | 0.2 | 0.8 | 20 | 39 | 98.6 |
| example 85 | 0.2 | — | 0.2 | — | 0.8 | 0.2 | 57 | 41 | 99.4 |
| example 86 | 0.2 | — | 0.2 | — | 0.6 | 0.4 | 55 | 40 | 99.5 |
| example 87 | 0.2 | — | 0.2 | — | 0.4 | 0.6 | 54 | 39 | 99.3 |
| example 88 | 0.2 | — | 0.2 | — | 0.2 | 0.8 | 53 | 39 | 99.3 |
| example 89 | 0.4 | — | 0.4 | — | 0.8 | 0.2 | 66 | 41 | 99.6 |
| example 90 | 0.4 | — | 0.4 | — | 0.6 | 0.4 | 64 | 41 | 99.7 |
| example 91 | 0.4 | — | 0.4 | — | 0.4 | 0.6 | 62 | 40 | 99.4 |
| example 92 | 0.4 | — | 0.4 | — | 0.2 | 0.8 | 60 | 40 | 99.6 |
| control 34 | 0.6 | — | 0.6 | — | 0.8 | 0.2 | 40 | 41 | 98.6 |
| control 35 | 0.6 | — | 0.6 | — | 0.6 | 0.4 | 40 | 40 | 98.4 |
| control 36 | 0.6 | — | 0.6 | — | 0.4 | 0.6 | 35 | 40 | 98.3 |
| control 37 | 0.6 | — | 0.6 | — | 0.2 | 0.8 | 36 | 39 | 98.4 |
| example 93 | 0.2 | — | — | 0.2 | 0.8 | 0.2 | 55 | 42 | 99.3 |
| example 94 | 0.2 | — | — | 0.2 | 0.6 | 0.4 | 52 | 40 | 99.3 |
| example 95 | 0.2 | — | — | 0.2 | 0.4 | 0.6 | 50 | 40 | 99.2 |
| example 96 | 0.2 | — | — | 0.2 | 0.2 | 0.8 | 50 | 39 | 99.2 |
| example 97 | 0.4 | — | — | 0.4 | 0.8 | 0.2 | 55 | 42 | 99.7 |
| example 98 | 0.4 | — | — | 0.4 | 0.6 | 0.4 | 53 | 41 | 99.5 |
| example 99 | 0.4 | — | — | 0.4 | 0.4 | 0.6 | 51 | 41 | 99.4 |
| example 100 | 0.4 | — | — | 0.4 | 0.2 | 0.8 | 50 | 40 | 99.7 |
| control 38 | 0.6 | — | — | 0.6 | 0.8 | 0.2 | 15 | 43 | 96.7 |
| control 39 | 0.6 | — | — | 0.6 | 0.6 | 0.4 | 10 | 46 | 97.0 |
| control 40 | 0.6 | — | — | 0.6 | 0.4 | 0.6 | 8 | 48 | 97.5 |
| control 41 | 0.6 | — | — | 0.6 | 0.2 | 0.8 | 7 | 49 | 98.0 |
| example 101 | 0.3 | 0.1 | 0.1 | 0.1 | 0.8 | 0.2 | 62 | 40 | 99.7 |
| example 102 | 0.3 | 0.1 | 0.1 | 0.1 | 0.6 | 0.4 | 60 | 40 | 99.3 |
| example 103 | 0.3 | 0.1 | 0.1 | 0.1 | 0.4 | 0.6 | 58 | 39 | 99.0 |
| example 104 | 0.3 | 0.1 | 0.1 | 0.1 | 0.2 | 0.8 | 59 | 39 | 99.1 |
| control 42 | 0.6 | 0.2 | 0.2 | 0.2 | 0.8 | 0.2 | 28 | 43 | 98.5 |
| control 43 | 0.6 | 0.2 | 0.2 | 0.2 | 0.6 | 0.4 | 26 | 41 | 98.0 |
| control 44 | 0.6 | 0.2 | 0.2 | 0.2 | 0.4 | 0.6 | 20 | 41 | 98.0 |
| control 45 | 0.6 | 0.2 | 0.2 | 0.2 | 0.2 | 0.8 | 10 | 40 | 98.3 |
| example 105 | 0.2 | — | 0.1 | 0.1 | 0.8 | 0.2 | 58 | 41 | 99.3 |
| example 106 | 0.2 | — | 0.1 | 0.1 | 0.6 | 0.4 | 56 | 41 | 99.2 |
| example 107 | 0.2 | — | 0.1 | 0.1 | 0.4 | 0.6 | 54 | 40 | 99.1 |
| example 108 | 0.2 | — | 0.1 | 0.1 | 0.2 | 0.8 | 52 | 40 | 99.0 |
| example 109 | 0.2 | 0.1 | — | 0.1 | 0.8 | 0.2 | 60 | 41 | 99.5 |
| example 110 | 0.2 | 0.1 | — | 0.1 | 0.6 | 0.4 | 62 | 40 | 99.3 |
| example 111 | 0.2 | 0.1 | — | 0.1 | 0.4 | 0.6 | 57 | 40 | 99.3 |
| example 112 | 0.2 | 0.1 | — | 0.1 | 0.2 | 0.8 | 53 | 39 | 99.3 |
| example 113 | 0.2 | 0.1 | 0.1 | — | 0.8 | 0.2 | 65 | 41 | 99.7 |
| example 114 | 0.2 | 0.1 | 0.1 | — | 0.6 | 0.4 | 63 | 40 | 99.4 |
| example 115 | 0.2 | 0.1 | 0.1 | — | 0.4 | 0.6 | 62 | 40 | 99.5 |
| example 116 | 0.2 | 0.1 | 0.1 | — | 0.2 | 0.8 | 64 | 40 | 99.7 |

Having now fully described the invention, it will be apparent to one of ordinary skill in the art that many changes and modifications can be made thereto without departing from the scope or spirit of the invention as set forth herein.

What is claimed as new and intended to be secured by Letters Patent:

1. A transparent, single phase, complex oxide ceramic material of the formula $(Sr_{1-x}Ca_x)(Li_{\frac{1}{4}}Nb_{\frac{3}{4}})O_3$ wherein x is 0.01–0.50.

2. A process for preparing a transparent, single phase, complex oxide ceramic material of the formula $(Sr_{1-x}Ca_x)(Li_{\frac{1}{4}}Nb_{\frac{3}{4}})O_3$ wherein x is 0.01–0.50 comprising:

blending the metal oxide components of transparent, complex oxide ceramic material with a binder;

shaping and pressing said blended materials under 0.5–2 ton/cm$^2$;

and sintering said shaped material under an atmosphere of oxygen at 1150°–1450° C. for 2–4 hours.

* * * * *